United States Patent [19]
Cox et al.

[11] 3,987,287
[45] Oct. 19, 1976

[54] HIGH DENSITY LOGIC ARRAY

[75] Inventors: Dennis T. Cox, Kingston; William T. Devine, Ulster Park; Gilbert J. Kelly, Red Hook, all of N.Y.

[73] Assignee: International Business Machines Corporation, Armonk, N.Y.

[22] Filed: Dec. 30, 1974

[21] Appl. No.: 537,219

[52] U.S. Cl. .............................. 235/152; 307/207; 328/92
[51] Int. Cl.² ...................................... H03K 19/20
[58] Field of Search ...................... 235/152; 307/207; 328/92; 340/172.5

[56] References Cited
UNITED STATES PATENTS

| | | | |
|---|---|---|---|
| 3,400,379 | 9/1968 | Harman | 340/172.5 |
| 3,731,073 | 5/1973 | Moylan | 235/152 |
| 3,761,902 | 9/1973 | Weinberger | 340/273 FF |
| 3,816,725 | 6/1974 | Greer | 235/152 |
| 3,818,252 | 6/1974 | Chiba et al. | 307/207 X |
| 3,849,638 | 11/1974 | Greer | 235/152 |

OTHER PUBLICATIONS

D. Hutton & W. Kautz, "A Simplified Summation Array for Cellular Logic Modules" *IEEE Tran. on Computers*, Feb. 1974, pp. 203–206.

*Primary Examiner*—David H. Malzahn
*Attorney, Agent, or Firm*—James E. Murray

[57] ABSTRACT

This specification describes arrays for performing logic functions. In these arrays, input variables can be fed to either or both ends of input lines. When input variables are fed to both ends of a line, the line is broken to separate logic performed on the variables fed to one end from the logic performed on the variables fed to the other end.

The arrays are compounded. Two arrays are arranged on opposite sides of a third array and the output signals from the two arrays function as input variables to the third array. Input lines in the third array can also be broken to separate array logic functions performed in the third array on variables fed to the opposite ends of such lines.

13 Claims, 11 Drawing Figures

FIG. 3
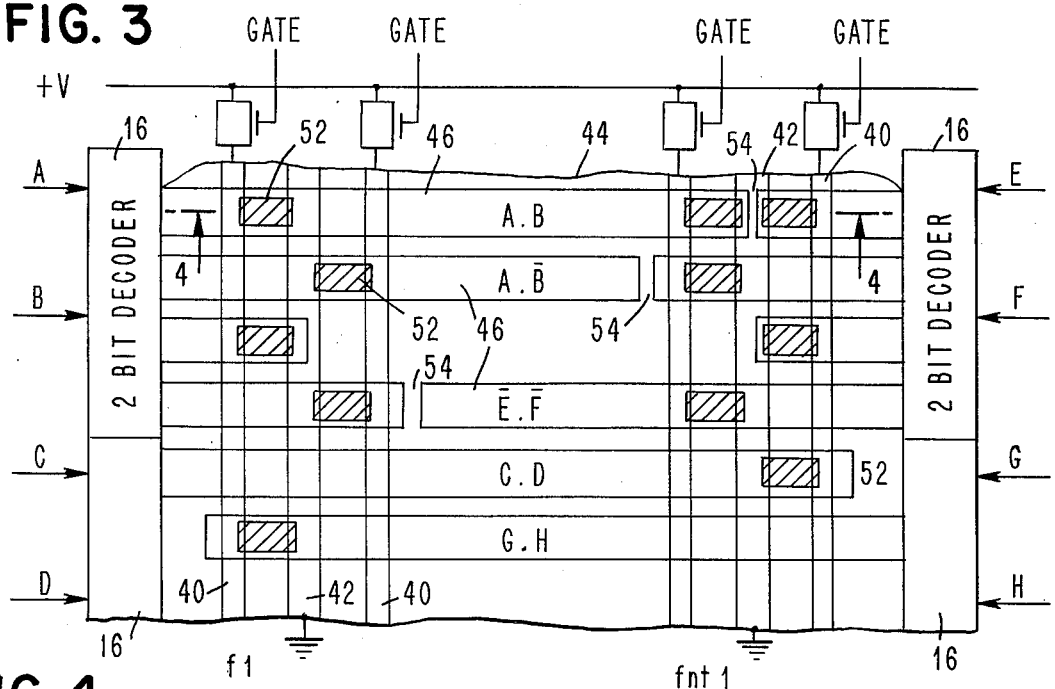
FIG. 4
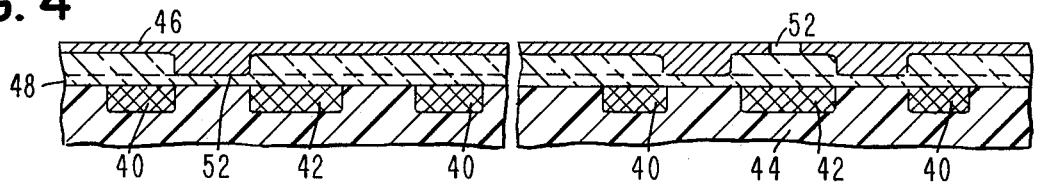
FIG. 2
| A.B | A.B̄ | Ā.B | Ā.B̄ | PRODUCT TERM FUNCTION FORMED |
|---|---|---|---|---|
| 0 | 0 | 0 | 0 | DON'T CARE |
| 0 | 0 | 0 | 1 | A + B |
| 0 | 0 | 1 | 0 | A + B̄ |
| 0 | 0 | 1 | 1 | A |
| 0 | 1 | 0 | 0 | Ā + B |
| 0 | 1 | 0 | 1 | B |
| 0 | 1 | 1 | 0 | A = B |
| 0 | 1 | 1 | 1 | A.B |
| 1 | 0 | 0 | 0 | Ā + B̄ |
| 1 | 0 | 0 | 1 | A ≠ B |
| 1 | 0 | 1 | 0 | B̄ |
| 1 | 0 | 1 | 1 | A.B̄ |
| 1 | 1 | 0 | 0 | Ā |
| 1 | 1 | 0 | 1 | Ā.B |
| 1 | 1 | 1 | 0 | Ā.B̄ |
| 1 | 1 | 1 | 1 | FALSE (NEVER USED) |

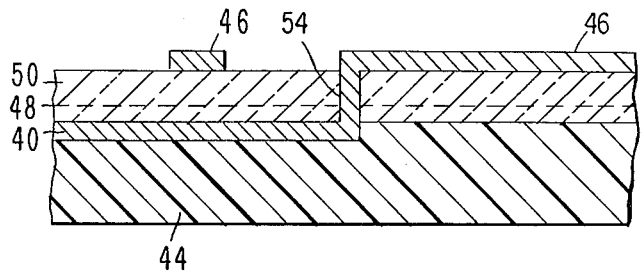
FIG. 5
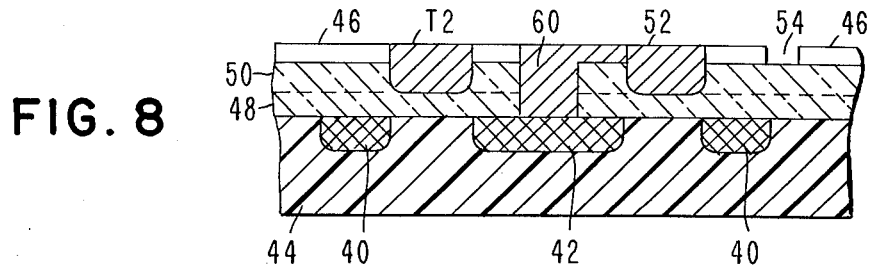
FIG. 8
FIG. 6
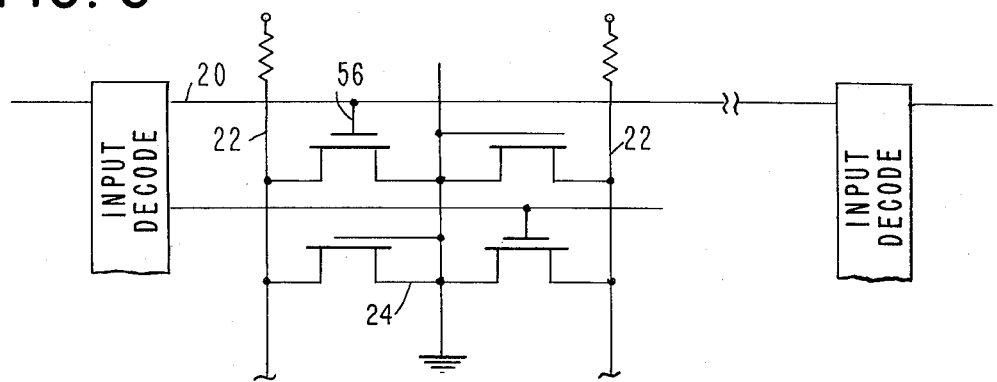
FIG. 7
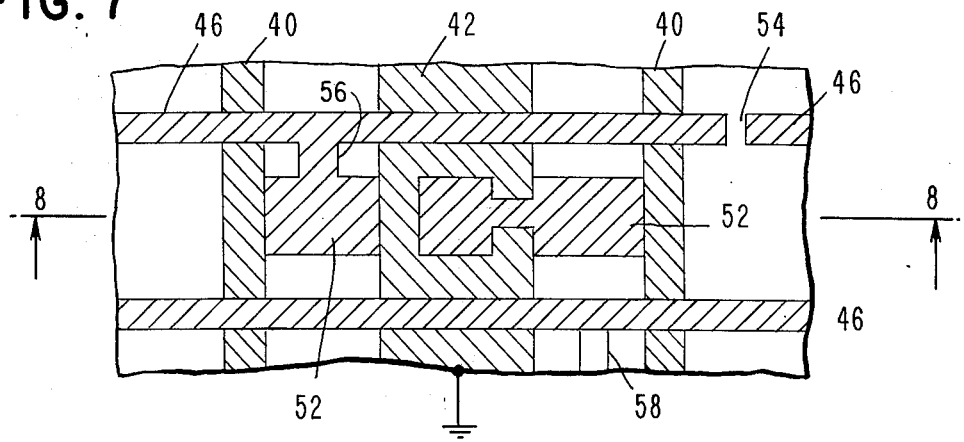

HIGH DENSITY LOGIC ARRAY

BACKGROUND OF THE INVENTION

The present invention relates to arrays for performing logic functions and more particularly it is related to increasing the number of logic functions performed in an array without increasing the size of the array.

The performing of logic in matrices of identical circuit elements each located at a unique intersection of an input and output line in a grid of intersecting input and output lines is well known. It is also well known that the standardization of logic circuit layouts stemming from the use of logic matrices or arrays results in the simplification and acceleration of the design and manufacturing of monolithic chips containing logic performing circuits. However, up until now the use of the logic arrays has been limited. A major cause in this limited use has been that only a small percentage of the intersections in an array turn out to be usable in performing logic functions. This percentage of useful intersections in the arrays results in inefficient use of the surface area of the monolithic chips on which the arrays are fabricated. It turns out, that for most applications, the design and manufacturing efficiencies of logic arrays are outweighed economically by their inefficient use of chip area and it is less expensive to spend additional time and effort to design and manufacture logic chips with highly customized layouts that are less orderly than logic arrays but perform for more logic functions in a given area of a monolithic chip.

The small percentage of usable logic circuits in a logic array is a result of the orderliness of the array. Once input and output lines are used to perform a given logic function they cannot be used in performing other unrelated logic functions without hopelessly unbalancing the logic. As a result, large areas of the array contain intersections of input and output lines that are barren of usable circuits.

A number of schemes have been devised to reduce the sparseness of the logic on logic array chips. One such scheme is to use a plurality of decoders to feed input variables to the input lines of a single array allowing a number of very powerful logic functions to be efficiently performed in a single array. Another scheme used to reduce sparseness involves using compound arrangement of arrays called programmable array logic chips (PLA's). These involve feeding the output of a first array called a product term generator, or an AND array, to a second array called the sum of a product term generator, or an OR array, so as to increase the number of functions that can be performed without geometrically increasing the number of array intersections needed to perform those functions. While these modifications increase the number of useful logic circuits that can be placed in an array logic chip, they do not solve the problem of the unusable portions of the input and output lines that is discussed above.

THE INVENTION

In accordance with the present invention, the size of the unusable portions of the input and output lines is reduced. This is accomplished by feeding input variables to either or both ends of the input lines. When input variables are fed to both ends of an input line the input line is segmented to separate the logic functions performed on input variables fed to one end from logic functions performed on input variables fed to the other. This arrangement cuts in half the length of the output lines needed to perform logic on a given number of input variables. The reduction in length of these output lines is compounded in the preferred embodiment of the present invention by splitting the AND array of a PLA into two and arranging the two halves on opposite sides of the OR array of the PLA. The OR array then receives outputs from both halves of the split AND array on opposite ends of its input lines. Input lines in both the AND and OR arrays are then segmented in the manner described above to separate different logic functions being performed on the same line.

Therefore, it is an object of the present invention to increase the amount of logic that can be performed by a logic array circuit chip of a given size.

Another object of the present invention is to reduce the size of segments of the array that cannot be used to perform usable logic functions.

A further object of the invention is to provide array logic that is more adaptable to the use of performing different logic functions.

THE DRAWINGS

These and other objects, features and advantages of the invention will be apparent from the following more particular description of the preferred embodiments of the invention of which:

FIG. 2 is a chart of the logic functions that can be performed on any two input variables in the programmed logic array chip of FIG. 1;

FIG. 3 is a plan view showing in more detail the layout of the AND array in FIG. 1;

FIG. 4 is a sectional view taken along line 4—4 in FIG. 3;

FIG. 5 is a sectional view taken through a via hole in an array module layed out in accordance with the schematic of FIG. 1;

FIG. 6 is an electrical schematic of an alternate layout scheme for the AND array in FIG. 1;

FIG. 7 is a plan view of the layout for the schematic of FIG. 6;

FIG. 8 is a sectional view taken along line 8—8 in FIG. 7;

DETAILED DESCRIPTION

Figure 1:
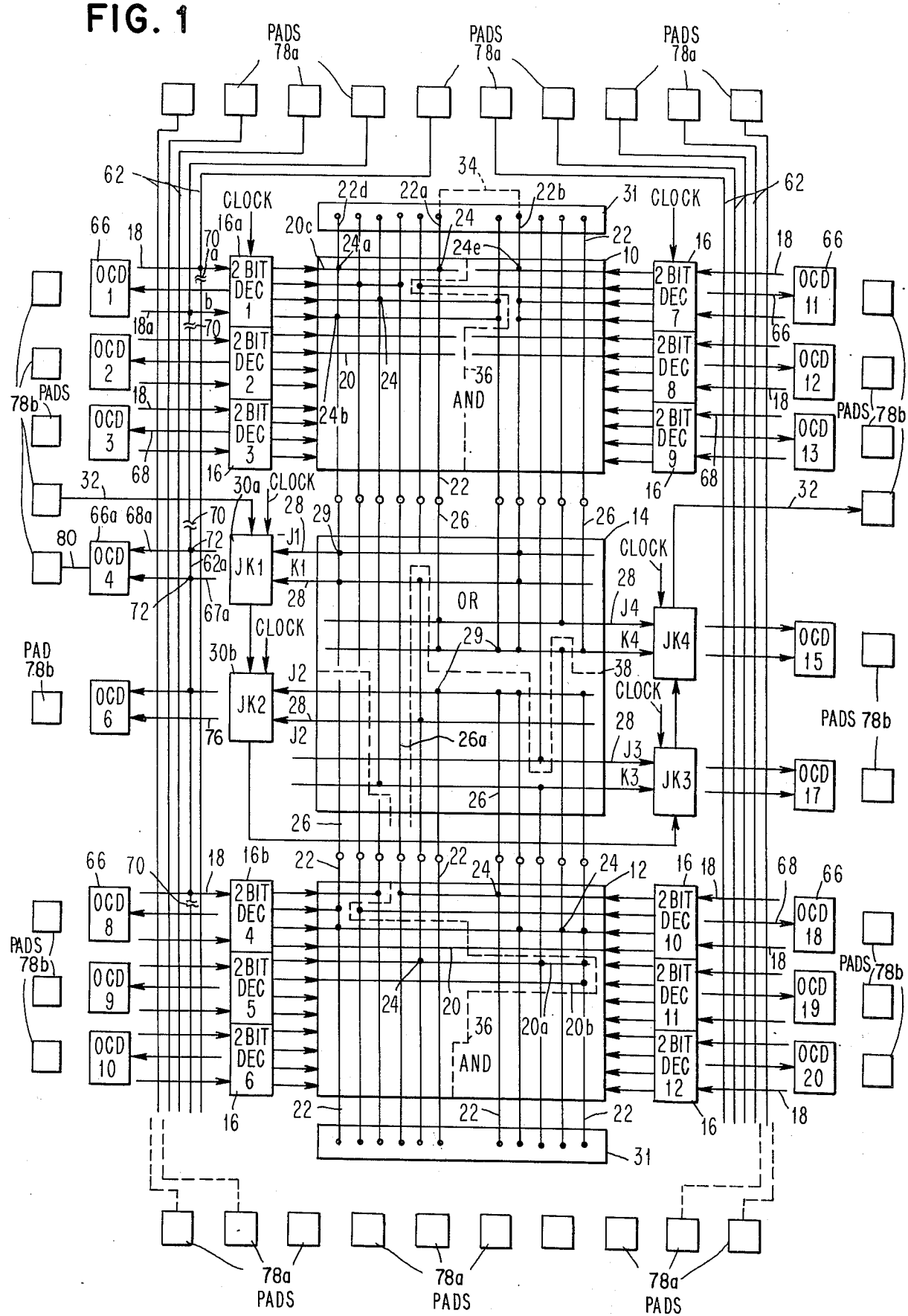
FIG. 1 is a schematic representation of a layout for a programmed logic array chip incorporating the present invention.

Referring now to FIG. 1, two AND arrays 10 and 12 are located on opposite sides of an OR array 14. Each of the AND arrays 10 and 12 is connected to a plurality of two bit input decoders 16 located on both sides of the AND arrays. These decoders 16 provide four output combinations of two input variables. The decoders 16 receive input variables on input lines 18 and feed each one of its four output combinations of two variables to a different input line 20 in the arrays 10 and 12. Because each input line 20 is connected to two different decoders 16 it can receive two different combinations of two variables.

Arranged orthogonally with respect to the input lines 20 are a plurality of parallel output lines 22 that form a grid with the input lines. Located at intersections of the input and output lines 20 and 22 are logic performing devices 24 that will perform a logical operation, in this case an AND operation, on data placed on the input lines 20 and provide the resultant on the output lines 22.

The output lines 22 of the AND arrays 10 and 12 are connected to the input lines 26 for the OR array 14 positioned between the two AND arrays. These input lines 26 intersect the output lines 28 of the OR array. Located at these intersections are logic producing elements 29 that perform an OR function with respect to the signals received from the AND arrays and provide the resultant on the output lines 28. The output lines 28 supply set and reset inputs to a plurality of JK latches 30 which are joined in shift register fashion so that data cannot only be placed in each latch 30 from the OR array but can also be placed onto line 32 from some external source and shifted from one latch to another.

As can be seen, logical functions can be performed on the inputs to the two bit decoders in the two bit decoders 16, the AND arrays 10 and 12, the OR array 14 and the JK latches 30. The different logical functions that can be performed in the AND arrays 10 and 12 on any two inputs to the decoders 16 are shown in FIG. 2. The headings on the column of this graph show the four possible outputs of any one of the two bit decoders 16 that receives a signal, $a$, on one of its inputs and a signal, $b$, on the other input. The legends on each row indicates the logical function that will be provided on an output line when the outputs of the decoder marked with a binary 1 in that row are ANDED together by coupling the proper input lines 20 to that output line 22 with logic performing elements 24. Performing logic operations using arrays and two bit decoders in this manner is well known and can be found in Weinberger U.S. Pat. No. 3,761,902, dated Sept. 25, 1973.

In accordance with the present invention, the logical functions are more densely arranged on array logic chips than possible in the prior art. This is accomplished by arranging decoders 16 on both sides of the AND arrays 10 and 12 and segmenting the input lines 20 and 26 in the AND and OR arrays to separate the functions performed on the different inputs to the same line. As can be seen in FIG. 1, the function performed in the first column of AND array 10 is the Exclusive OR function of the two signals coming in from the decoder 16a in the upper left hand side of the AND array. It is fed into the first JK 30a which receives the resultant signal on both its set and reset inputs preventing the JK from latching thereby providing an unlatched output signal. A number of other functions are performed in this array 10 involving the output signals from decoders on both the right and left hand side. When they involve the same input lines, they are separated by breaks in the input lines from functions being performed on the right hand side. A dotted line 36 down through these breaks indicates the separation of arrays 10 and 12 into portions performing functions involving the input variables to the left hand decoders and in those involving input variables to the right hand decoders. Similarly the lower array is divided by a dotted line 36 along the breaks in the input lines. However, you will not that the input lines 20 are not always broken. They continue completely across the array such as lines 20a and 20b do when they are involved in performing functions on inputs to either but not both the left or the right decoders. Some times it is desirable that functions fed to opposite ends of the same input line 20c be ANDED.

This is accomplished within terminal boxes 31 at each end of the AND arrays 10 and 12 by providing a connection 34 between two output lines 22a and 22b to which the input line 20c is coupled by logic performing elements 24d and $e$.

Like in the AND arrays, the input lines 26 of the OR array are broken to separate functions performed on input variables received from the top AND array 10 from functions performed on input variables received from the bottom AND array 12. Dotted line 38 has been placed through the OR array to show how the space in the OR array is divided up between that performing inputs from the top and those performing logical functions from inputs on the bottom AND array. It should be noted that line 26a extends all the way through the OR array so that it performs a logical function on input variables supplied to both the top and bottom arrays. This may be desired in some cases.

By examining the dotted lines 36 and 38, you can see that the use of the arrays is more intense than it would be if all the inputs were on one side of the array. First of all with all the inputs on one side, there would not be double use of input lines. In other words, portions of input lines not used to perform functions involving one set of input variables could not be used to perform functions involving another. Also if the decoders were all placed on one side of the line and the two AND arrays were added together, the length of the output lines would have to be extended considerably and larger portions of these output lines would be unusable. For instance, output line 22d involved in performing an Exclusive OR of inputs $a$ and $b$ to the first decoder 16a would be four times as long if all twelve decoders 16 of the two AND arrays 10 and 12 were placed on one side of a single array and therefore would have four times as much unusable area of the chip arranged along it than is in the arrangement shown in FIG. 1. In the same way, division of the OR array decreases the amount of unused area on the chips.

The maximum extent of the improvement can be analyzed in the following manner. Assume that a PLA having X inputs, Y outputs and N product terms is needed. The following would be a comparison of the size of the arrays needed in accordance with the prior art and the present invention.

| Prior Art | Present Invention | |
|---|---|---|
| 2XN | $\frac{XN}{2}$ | AND ARRAY(S) |
| YN | $\frac{YN}{2}$ | OR ARRAY |
| 2XN+YN | $\frac{XN}{2} + \frac{YN}{2}$ | TOTAL | if the input/output ratio was one eg X=Y, the present invention results in the following array size reductions

| | | |
|---|---|---|
| AND | 4 | |
| OR | 2 | Improvement Factor |
| TOTAL | 3 | |

Further improvement is possible if the output lines 28 of the OR array were not required to intersect all product terms. For example, if the horizontal output lines 28 shown in FIG. 1 were terminated at the midpoint of the array and outputted on both sides of the array 14 the array sizes would be:

| Prior Art | Present Invention | |
| --- | --- | --- |
| 2XN | $\frac{XN}{2}$ | AND ARRAY |
| YN | $\frac{YN}{4}$ | OR ARRAY |
| 2XN+YN | $\frac{XN}{2} + \frac{YN}{4}$ | TOTAL | again if the input to output ratio were one

| AND | 4 | |
| --- | --- | --- |
| OR | 4 | Improvement Factor |
| TOTAL | 4 | |

This indicates that for a unity I/O ratio the improvement factor of between 3 and 4 can be obtained by using the present invention. While a complete division of the OR array 14 may cause problems, a division of the OR array into Y/2 lines feeding completely through (as shown) and Y/2 lines terminating at the midpoint is viewed as presenting no difficulty in implementing the logical personality.

FIGS. 3 and 4 show how the AND arrays 10 and 12 can be fabricated in FET technology using a combination of gate and metal personalization of the array. A number of diffusion stripes 40 and 42 are made into the substrate 44 for the array. These diffusions 40 and 42 are the source and sink diffusions for FET's which are the logic performing elements 24 of the array. In addition the diffusions 40 serve as the output lines 22 of the array. The input lines 20 of the array are metal stripes 46 arranged at right angles to the diffusions 40 and 42 on top of thin and thick layers 48 and 50 of oxide that decouple the lines. Whenever a logic function is to be performed at the intersection a gate metalization 52 is placed over a set of diffusions 40 and 42 on the thin metal oxide layer 48 and under one of the metal stripes. Where there is no logic function to be performed at the intersection of a particular input line and output line no such gate metalization pattern is placed between the stripes 40 and 42.

As can be seen from FIGS. 3 and 4, breaks 54 occur in the metal stripes between functions performed on one side of the stripes and functions performed on the other side of the stripes. Thus, it is quite apparent with this technique that the manufacturing steps of all the chips would be the same until the point of laying out the gates and metalization. The chip can then be personalized to perform the desired logic functions by adding the metal gates where the logic function is to be performed at an intersection and providing for breaks in the line where functions are performed on opposite ends of the same line.

In the completed chip, each metal line 46 becomes the input to an FET logic circuit in which the gate metalization 52 is the gate of an FET having a source connected by diffusion stripe 40 through gated FETs to some positive voltage +V and connected to ground by diffusion stripe 42. The gated FETs are periodically rendered conductive by a clock pulse to charge the diffusion stripes, 40 positive. During alternate periods the outputs of decoders 16 are gated onto the metal stripes 46. When a signal is received from the decoders 16 on metal stripes 46 it biases each FET connected thereto conductive for providing a path to ground changing the voltage on the diffusion stripe 40 or output line 22 from +V to ground. Since the outputs of the decoders are the negative of the inputs to the decoders a logical AND function is performed in the arrays 10 and 12 on the outputs of the decoders.

The OR array 14 is quite similar to the AND array except the OR array is arranged with the metal stripes vertically and the diffusion stripes horizontally. Furthermore, the output of the AND array is positive with respect to the input of the decoders so that a NOR function is performed by elements 29 in the OR array on the outputs of the AND arrays. The output of the OR array is inverted in the latches 30 so that an OR function is performed on the outputs of the AND array in the OR array and the latches. The outputs of the latches are gated on while the diffusions of the AND array are being charged. Unlike the diffusions in the AND array, the diffusions 40 in the OR array are continuously charged.

As shown in FIG. 5, to make the connection between the AND arrays and the OR arrays, one of the metal stripes 46 in the OR array connects to one of the diffusions 40 in the AND array by way of a metalized via hole 54 through the oxide layers 48 and 50.

While a gate-metal personalization is desirable in most cases, there are situations in which it is desirable to have circuit arrangement in which logic can be changed by a purely metal personalization process. Such an arrangement is shown in FIGS. 6, 7 and 8. In the embodiment of FIG. 6 each of the intersections of input and output lines 20 is populated by an FET 24 for performing logic. Whether the FET is functioning or not depends on how its gate is connected. If the FET 24 is not being used its gate is grounded to hold the FET biased off. If the FET 24 is being used to perform logic, its gate is connected to one of the input lines 22 to allow the FET to be rendered conducting or non-conducting by the pulses placed on the input line 20. As shown in FIGS. 7 and 8, each FET is provided with a gate and metal connections 58 are selectively made from the gates 52 to the metal stripes 46 or to a diffusion stripes 42 through a via connection 10 in one processing step. It should be understood that the invention is not limited to either one of the above personalization techniques and can be applied equally as well to a number of technologies. In particular, it can be applied to bi-polar technology instead of the described FET technology.

Figure 9:
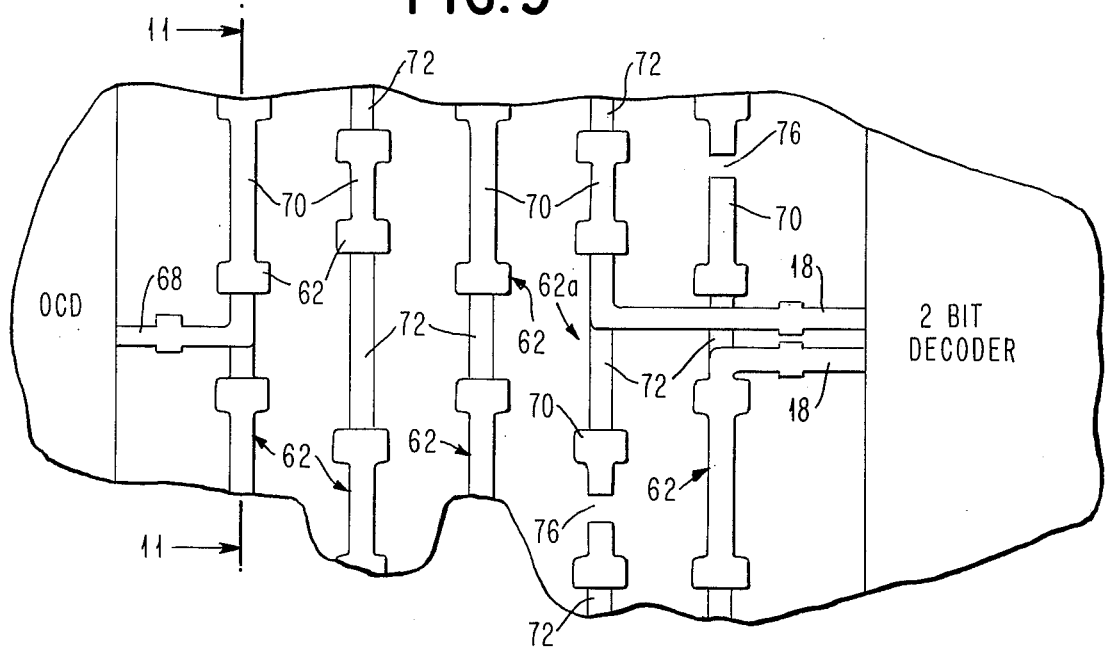
FIGS. 9 and 10 are more detailed plan views of the system of rails shown in FIG. 1.
Figure 10:
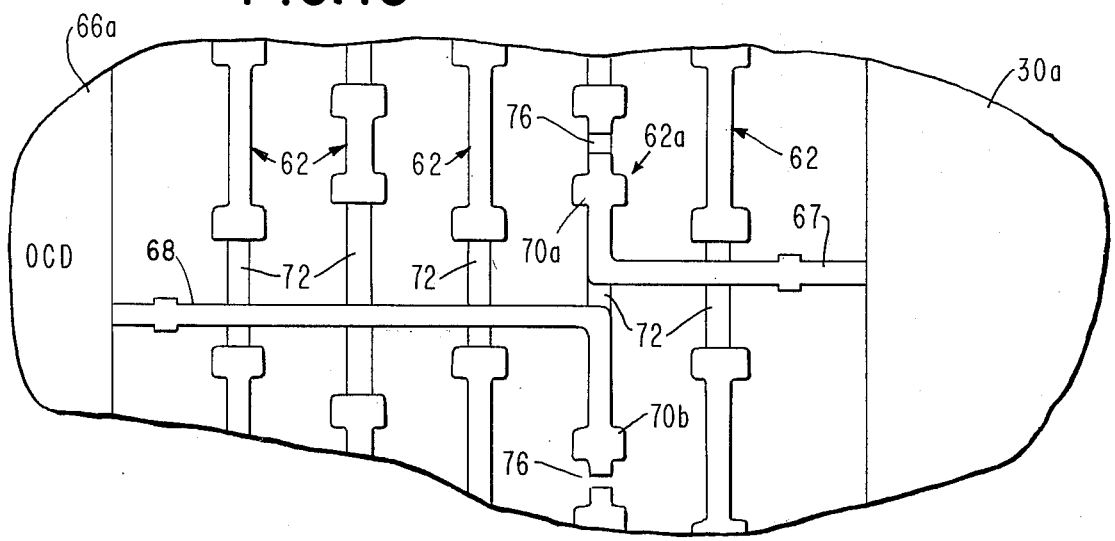
Figure 11:
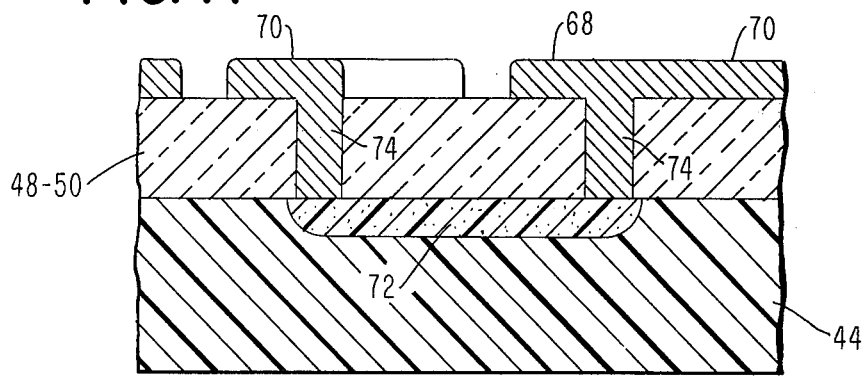
FIG. 11 is a section taken along line 11—11 in FIG. 9.

As claimed in copending application Ser. No. 537,218 filed on even date herewith now U.S. Pat. No. 3,936,812, the connections to the inputs in outputs of the arrays can be personalized in accordance with the functions to be performed in the array. To this end, a plurality of vertical rails 62 are provided on the chip on each side of the arrays 10, 12 and 14. Arranged orthogonally with respect to these rails 62 are the inputs 18 to the decoder 16, the outputs 67 of the JK's and the inputs 68 of the off chip drivers 66. As shown in FIGS. 9, 10 and 11 the input lines 18 and 68 and the output lines 67 are metallized patterns on the surface of the oxidation layer 48–50 of the chip. The rails 62 are each made up of alternating metal portions 70 on top of the oxidation layer 48–50 and diffused portions 72 in the substrate 44 of the chip. These are joined by metallized via holes 74 that pass through the oxidation layer 48–50. The diffused portions 72 are located opposite the off chip drivers 66, the decoders 16 and the latches 30 so that the lines to the drivers, latches and decoders can pass over the diffused portions of certain of the rails 62 and be connected to metallized portions of other of the rails. The rails are segmented by openings 76 in the metal portions 70 to electrically isolate two or more different signals contained on the same rail on electrically isolated segments of the same rail. For instance, suppose JK 30a is to be connected to the off chip driver 66a, the metal lines 67 and 68 are connected to opposing metal portions 70a and 70b of the same rail 62a. The metal lines 67 and 68 pass over the diffused portions 72 of the other rails 62 so they do not short the rails together. Furthermore, the metallized portions 70a and 70b of rail 62a both contain an opening to isolate the segment of rail 62a containing the connection between the JK 30a and the off chip driver 66a from the remainder of the rail 62a so that the remainder of the rail can be used to carry other signals to the array such as the connection between JK 30b and the input to two-bit decoder 16b. It should be noted that the inputs to the decoders 16 are positive and the outputs of the JK are also positive so the outputs of the JK 30a can be directly connected back to the decoders 16b permitting sequential logic to be performed with the arrays 10, 12, 14 and JK's 30 without the use of off chip connections between the JK's and the decoders. Connected across the top of the chip and the bottom of the chip are a number of pads 78a which function exclusively as input pads for input signals onto the chip to be fed to the inputs of the decoders 16. They are connected to the rails 62 by a metalization pattern determined by the functions to be performed on the chips. The pads 78b along the side of the chip may be used either as output pads or input pads. If they are used as output pads they are connected by metal personalization 80 to one of the off chip drivers 66. If they are used as input pads along with pads on the bottom and top of the array are connected by personalization directly to the rails 62.

Above we have described one embodiment of the invention. As can be seen, it permits alternate uses for various elements in the array logic chip. In this way it is similar to a virtual memory which from the outside appears to have a larger capacity than it actually does. The reason for this is that like in the memory the actual capacity is used very inefficiently so that the lines and terminals can be assigned duplicate use so long as those uses do not conflict.

In order to make the understanding of the present invention easier, the illustrated PLA was limited in size and number of associated circuits. If fact, substantially larger arrays are anticipated. For instance, two AND arrays having 48 inputs and each being served by 24 decoders would be more reasonable than the illustrated AND arrays. In the same way an OR array having 112 outputs feeding 56 JK's would also be more in the order of what actually would be found on one of these chips.

While the invention has been particularly shown and described with reference to a preferred embodiment thereof, it will be understood by those skilled in the art that the above and other changes in form and details may be made therein without departing from the spirit and scope of the invention.

What is claimed is:

1. In a logic performing arrangement including an array having a plurality of input lines intersected by a plurality of orthogonally oriented output lines with logical elements located at at least some of the intersections of the input and output lines so that logical functions are performed on interrogation signals placed on the input lines and the responses thereto placed on the output lines, the improvements comprising;
   different interrogating means coupled to opposite ends of the same input lines so that two different interrogating signals can be placed on each of said same input lines; and
   input lines in the plurality of input lines which are split into two segments to separate from one another on different segments of the same input line two different sets of logical elements coupled on that same input line so the two different interrogation signals each interrogate only one set of logical elements whereby the number of logic functions performed by the array can be increased without increasing the number of intersections of input and output lines.

2. The logic performing arrangement of claim 1 wherein said interrogating means are different decoders coupled to opposite ends of the same input lines.

3. The logic performing arrangement of claim 2 wherein the different decoders each decode two input signals each and in response thereto place an interrogation signal on one of the input lines coupled thereto.

4. The logic performing arrangement of claim 1 wherein said array is a sum of product term generating array and said interrogating means is two product term generating arrays one positioned on each side of the sum of product term generating array with each product term generating array having one output line connected to one input line of the sum of product term generating arrays.

5. The logic performing arrangement of claim 4 wherein at least one of said input lines in the sum of product term generating array is not split into two segments so that logic can be performed on outputs of both the product term generating arrays coupled to that line.

6. The logic performing arrangement of claim 1 wherein the splits that divide in the input lines into two segments occur at different points along the input line in different input lines.

7. The logic performing arrangement of claim 6 wherein one of plurality of said different interrogating means coupled to input lines of the array is not used and those input lines are not broken to separate logic performing elements coupled to that line.

8. In a programmable logic array chip having a product term generating array made up of a plurality of input lines intersected by a plurality of output lines with logical elements located at the intersection of some of the input and output lines and with the input lines receiving interrogating signals from a plurality of decoders, and having a sum of product term generating array made up of a plurality of input lines intersected by a plurality of output lines with logical elements located at the intersection of some of the input and output lines, and with the input lines of the sum of the product term generating array receiving on its input lines the outputs of the product term generating array made in response to the interrogations and which in turn supplies inputs to a string of latches on its output lines, the improvement comprising:

two of said separate product term generating arrays positioned on opposite sides of said sum of product term generating array with each of the input lines of the sum of product term generating array coupled to one of the output lines of the two separate product term generating arrays so that the sum of product term generating array receives signals from each of the two separate product term generating arrays.

9. The programmable logic array of claim 8 wherein breaks occur in lines of the product term and sum of product term generating arrays at different points in different lines to separate logic functions performed in the arrays.

10. The programmable logic array chip of claim 8 in which at least one of the the input lines of the sum of product term generating arrays are broken to separate functions performed in the sum of the product term generating array on the two signals fed to that input line by the product term generating arrays.

11. The programmable logic array of claim 10 where not all the input lines of the sum of product term generating array are broken so that logic functions can be performed which involve the output of the two product term generating arrays connected to the line.

12. The programmable logic array of claim 11 wherein different decoders in said plurality of decoders are connected to opposite ends of the same input lines in both the product term generating arrays; and input lines in the product term generating arrays are segmented at different points in different input lines to separate functions performed along the segmented input lines on interrogating signals from one of the decoders coupled to the segmented lines from those functions performed on input signals from the other of the decoders coupled to that one.

13. In a programmable logic array chip having a product term generating means receiving interrogating signals from a plurality of decoders, a sum of product term generating means, receiving the outputs of the product term generating means in response to the interrogations and which in turn supplies inputs to a string of latches on its output lines, the improvement comprising:

the product term generation means and the sum of the product term generating means are formed of at least three separate arrays with one of the generating means made up of one of the arrays and the other generating means made up of the other two arrays and, with breaks occurring in lines of all the arrays at different points in different lines to separate logic functions performed in the arrays.

* * * * *